United States Patent
Millen et al.

Patent Number: 5,659,270
Date of Patent: Aug. 19, 1997

[54] APPARATUS AND METHOD FOR A TEMPERATURE-CONTROLLED FREQUENCY SOURCE USING A PROGRAMMABLE IC

[75] Inventors: David W. Millen, Yorkville; Carl Wojewoda, Lake Zurich, both of Ill.

[73] Assignee: Motorola, Inc., Schaumburg, Ill.

[21] Appl. No.: 648,722

[22] Filed: May 16, 1996

[51] Int. Cl.⁶ .................................................. H03B 5/32
[52] U.S. Cl. ........................ 331/69; 331/70; 331/176; 331/158; 310/315; 310/343
[58] Field of Search ...................... 331/69, 70, 176, 331/158; 310/315, 343

[56] References Cited

U.S. PATENT DOCUMENTS

| | | | |
|---|---|---|---|
| 4,454,483 | 6/1984 | Baylor | 331/11 |
| 4,489,289 | 12/1984 | Slobodnik et al. | 331/107 |
| 4,613,861 | 9/1986 | Ault | 340/825.73 |
| 4,839,613 | 6/1989 | Echols et al. | 331/69 |
| 4,893,097 | 1/1990 | Zwack | 331/176 |
| 4,899,117 | 2/1990 | Vig | 331/3 |
| 4,985,687 | 1/1991 | Long | 331/69 |
| 5,041,800 | 8/1991 | Long et al. | 331/69 |
| 5,081,431 | 1/1992 | Kubo et al. | 33/158 |
| 5,180,942 | 1/1993 | Marvin et al. | 310/346 |
| 5,392,005 | 2/1995 | Bortolini et al. | 331/44 |

*Primary Examiner*—Robert Pascal
*Assistant Examiner*—An T. Luu
*Attorney, Agent, or Firm*—Brian Mancini; Gary Cunningham

[57] ABSTRACT

A substantially sealed frequency source (10) including a crystal oscillator (14) and a programmable IC (22) thermally and electrically coupled on a substrate (12). The IC (22) is accessed through an interface (26) with programming signals (42) so as to provide an analog temperature control signal (34) and a crystal oscillator frequency adjustment signal (36). The substrate (12) maintains a substantially constant temperature at a turning point (82) on a frequency-temperature response curve (80) of the crystal (64). The IC (22) allows programming of the source (10) after sealing to compensate for shifts in the crystal frequency-temperature response (80) due to sealing. The IC (22) provides electrical correction of the substrate temperature setpoint and the crystal oscillator frequency without mechanically or thermally disturbing the internal components of the source (10).

19 Claims, 2 Drawing Sheets

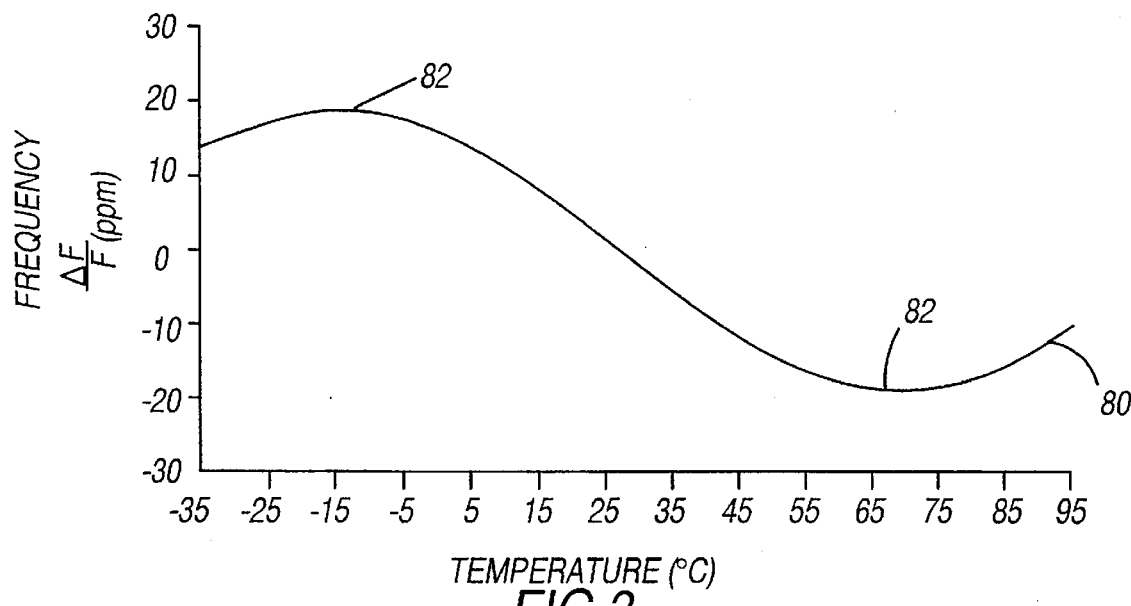
FIG.3
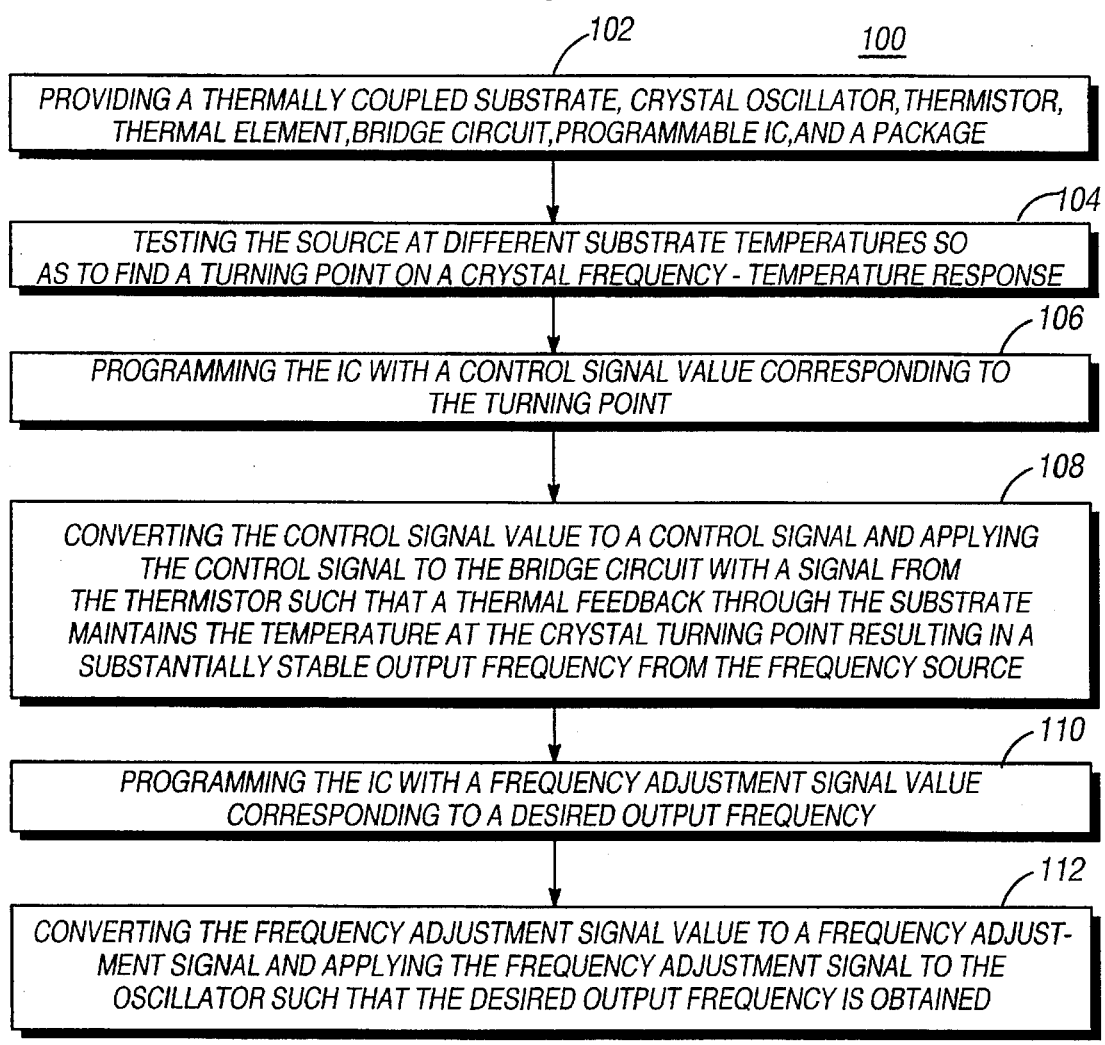

APPARATUS AND METHOD FOR A TEMPERATURE-CONTROLLED FREQUENCY SOURCE USING A PROGRAMMABLE IC

FIELD OF THE INVENTION

The present invention relates generally to temperature-controlled crystal oscillators, such as oven controlled crystal oscillators (OCXOs), used to provide stable reference frequencies for radio communications equipment and, in particular, to an apparatus and method for a temperature-controlled frequency source using a programmable IC.

BACKGROUND OF THE INVENTION

Generally, the operating frequency of a piezoelectric crystal will vary when exposed to different temperatures. This is called the frequency-temperature (FT) response curve of the crystal. The function of an oven controlled crystal oscillator (OCXO) is to minimize this frequency change over temperature by maintaining the crystal within a stable thermal environment. Additionally, the normal temperature dependence of some components of the oscillator's amplifier and feedback networks will change loop reactance, and thereby the output frequency. These components, along with the crystal, are called the critical components. Typically, the critical components are kept within the guarded temperature range of an oven so as to maintain the critical components at a relatively constant temperature. However, in practice, oven temperatures are never perfectly constant. They will vary over a small range. Therefore, it is best to operate the oven at a nominal temperature where the FT response of the crystal is relatively flat. In this way, if the oven temperature varies slightly, the crystal frequency will not change substantially. Crystal FT responses are nominally flat at minimum or maximum (turning) points on their FT curves. Typically, the crystals chosen for OCXO applications have a minimum or a maximum turning point somewhat above a normal ambient operating temperature so as to enable the use of a heating element to maintain a constant temperature, but not so high as to cause poor long term stability (aging) of the crystal, reliability impact on the associated electronics, or excessive power consumption. The most popular crystals for this type of application are AT and SC-cut quartz which have a turning point in their FT response somewhat above the highest expected operating ambient temperature.

Typically, OCXOs are provided with separate fixed or variable components for both tuning a crystal oscillator onto a desired frequency and setting an oven at a desired temperature. Prior art OCXOs provide external access to a variable capacitor to adjust (warp) the crystal oscillator onto a desired nominal frequency. However, the non-hermetic opening provided for this external access adversely affects temperature stability within the temperature controlled volume of the oven by allowing convective heat transfer to the environment. Further, the opening can lead to degradation of insulation or corrosion of internal components when the OCXO is operated in humid or otherwise hostile environments. In addition, OCXOs using analog oven circuits have required the manual insertion of components to match oven temperature to a crystal's turning point. Alternatively, OCXOs using digital oven circuits have required the use of additional A/D circuits to convert a temperature sensor signal into a digital form.

In operation, an oven is individually set at a turning point temperature for each particular crystal. To accomplish this, crystals undergo preliminary testing to determine the temperatures of their turning points. However, as the OCXO is assembled or sealed or the crystals are subjected to mounting or thermal cycling stresses, the turning points or frequency of the crystal may shift. Also, the thermal paths in the OCXO will typically change when the package is sealed. This changes the temperature gradients from the critical components to the temperature sensor. In addition, convection current variations, burn-in testing, and quality control testing may cause the turning points or frequency of the crystal to shift. This causes a problem because the package of an OCXO does not easily allow for re-adjustment of the oven temperature. Therefore, any shifts are difficult to recompensate without opening the OCXO to substitute or adjust components. Afterwards, there is no guarantee that the crystal or package thermal gradients may not shift again during reseating.

Another problem with the present use of manually adjusted warp components is that, although they generally have a significant adjustment range to compensate for a limited frequency accuracy of the crystal, they are not always made available to the end user. This may occur when a customer requires a completely hermetic package, thereby sealing off the warp components from external access. Without this access the working life of the OCXO is limited. If the warp adjustment were available to the end user, the working life of the OCXO could be extended.

There is a need for a temperature-controlled frequency source having a temperature control component and a crystal oscillator that: are sealed from the outside environment; do not need separate fixed or variable components for adjustment; can be adjusted before and after assembly of the source or during use in the field; do not require multiple adjustments to be properly set; and can be electrically adjusted without having to mechanically or thermally disturb the internal circuitry of the frequency source. In addition, it is desirable to provide a low cost, small sized frequency source that uses a reduced number of components, and does not require the use of a separate oven chamber.

BRIEF DESCRIPTION OF THE DRAWINGS

FIG. 3 is a graphic illustration of a frequency-temperature response curve of an AT-cut quartz crystal, in accordance with the present invention; and FIG. 4 is a flow diagram of a method to provide a temperature-controlled frequency source using a programmable IC, in accordance with the present invention.

DETAILED DESCRIPTION OF THE PREFERRED EMBODIMENT

Figure 1:
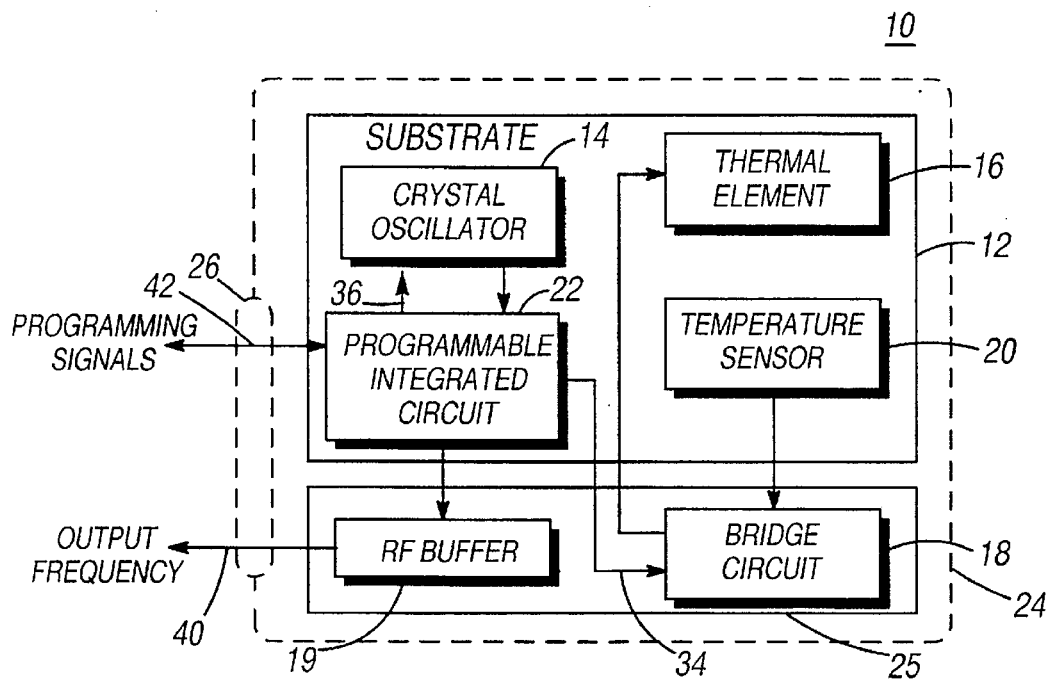
FIG. 1 is a block diagram of a circuit which provides a temperature-controlled frequency source using a programmable IC, in accordance with the present invention.

FIG. 1 shows one embodiment of a temperature-controlled frequency source 10, in accordance with the present invention. A substantially isothermal substrate 12 is provided upon which is mounted an oscillator 14, a temperature sensor 20, a thermal element 16, and a programmable integrated circuit (IC) 22. The source 10 also includes a bridge circuit 18, RF buffer 19 and a support module 25. In a preferred embodiment, the bridge circuit 18 and RF buffer 19 are mounted on the support module because their temperature dependence does not significantly affect the frequency source performance. Whereas, increasing the dimensions of the substrate 12 to accommodate the bridge circuit 18 and RF buffer 19 would degrade performance and increase power consumption.

All of the aforesaid components are enclosed within a substantially sealed environment by a package 24. The sealed package 24 advantageously serves to isolate the substrate 12 from adverse external temperature fluctuations. A sealed input/output (I/O) electrical interface 26 is provided in the package 24 to allow programming signals 42 access to the IC 22. The output frequency 40 of the source 10 also passes through the interface 26. In a preferred embodiment, the programming signals 42 take the form of digital data.

The substrate 12 also serves as a printed circuit board to electrically connect the above components and circuitry. In general, the substrate 12 is a ceramic. Preferably, the substrate 12 is of alumina, aluminum nitride, beryllium oxide or other ceramic of relatively high thermal conductivity. In particular, the substrate 12 maintains a temperature gradient of within about 0.5° C. between components mounted thereon. The support module 25 may be of any conventional printed circuit board material.

Figure 2:
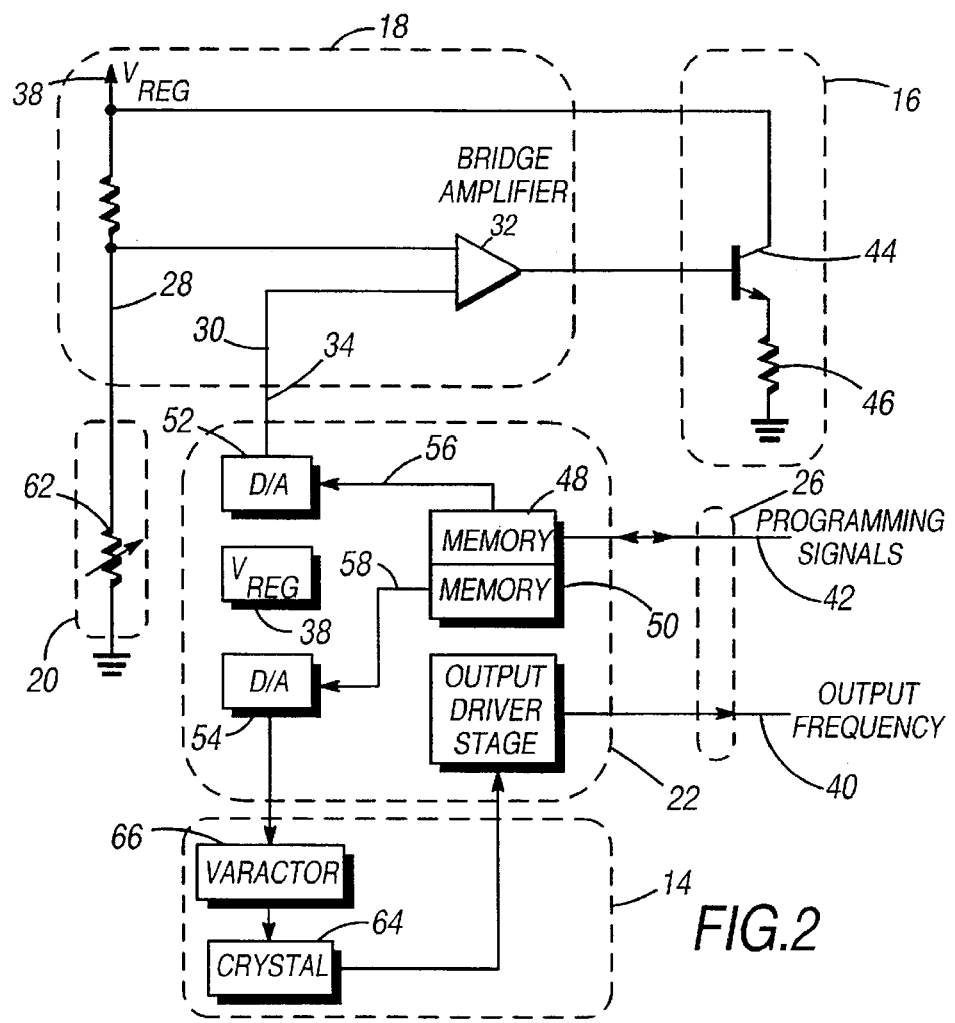
FIG. 2 is a block diagram of the circuit of FIG. 1 showing specific detailed elements of the frequency source, in accordance with the present invention.

FIG. 2 shows a preferred embodiment of the frequency source 10 of FIG. 1. The oscillator 14 includes a piezoelectric crystal 64 having a frequency-temperature (FT) response curve (shown as 80 in FIG. 3) and being thermally coupled to the substrate 12. The thermal element 16 is also mounted on and thermally coupled to the substrate 12. The thermal element 16 drives the substrate 12 substantially to a turning point temperature (shown as 82 in FIG. 3) of the frequency-temperature response curve of the crystal 64. The temperature sensor 20 is also mounted on and thermally coupled to the substrate 12. In this way, the crystal 64, oscillator 14, temperature sensor 20 and thermal element 16 are all thermally coupled to each other through the substrate 12. Preferably, the crystal 64, oscillator 14, temperature sensor 20 and thermal element 16 are located in proximity to one another on the substrate 12. The temperature sensor 20 is selected from the group of a thermistor, a diode and a diode-connected transistor. In a preferred embodiment, the temperature sensor 20 is a thermistor 62 and the thermal element 16 consists of a current-pass transistor 44 with a current limiting resistor used as a resistive heating element 46 coupling waste heat to the substrate 12. However, the resistive heating element 46 may be used as the sole thermal element 16. Alternatively, the element 16 may consist of a Peltier element used for heating or cooling the substrate 12 to maintain the crystal 64 at a turning point temperature.

The present invention includes a bridge circuit 18 having a first and second leg 28,30. The bridge circuit 18 is electrically coupled to a bridge amplifier 32 which provides a signal for driving the thermal element 16. The temperature sensor 20 is electrically coupled in the first leg 28 of the bridge circuit 18. The programmable IC 22 provides a control signal 34 to the second leg 30 of the bridge circuit 18. Because the temperature sensor 20 and thermal element 16 are thermally coupled through the substrate 12, the substrate 12 provides a thermal feedback from the element 16 to the temperature sensor 20 in the bridge circuit 18 such that a temperature of the substrate 12 is controlled by the control signal 34. In addition, the thermal feedback is analog by nature.

Advantageously, the analog feedback allows higher resolution than can be obtained by digital adjustments. In addition, analog control prevents frequency jumping which can occur with abrupt digital control changes in prior art OCXOs. For this reason, the substrate 12 does not require significant thermal mass, as is required when purely digital prior art controllers are used.

The IC 22 includes at least one non-volatile memory (shown as 48,50) which is used to generate the bridge circuit control signal 34. The memory is written to by the programming signals 42 through the interface 26 of the package 24. The at least one memory of the IC 22 also provides a frequency adjustment signal 36 for controlling the oscillator 14. The memory is only required to hold two values which simplifies operation considerably and saves space on the IC 22. Preferably, the adjustment signal 36 is applied to at least one varactor 66, which is coupled to the crystal 64, so as to change (pull) the frequency to a desired nominal value.

In a preferred embodiment, the IC includes first and second non-volatile memories 48,50, each holding a single value, and first and second D/A converters 52,54. The first memory 48 applies a first digital signal 56 to the first converter 52 such that the first converter 52 provides an analog control signal 34 to the second leg 30 of the bridge circuit 18. The second memory 50 applies a second digital signal 58 to the second converter 54 such that the second converter 54 provides an analog frequency adjustment signal 36 to the crystal oscillator 14. The IC 22 is programmed to maintain the temperature of the crystal 64, through its thermal coupling to the substrate 12 and element 16, substantially at a turning point (shown as 82 in FIG. 3) of the crystal FT response (shown as 80 in FIG. 3).

In operation, once the source is fully assembled and sealed, it is tested. This is done by sequentially loading different substrate control values into the memory. After each value is entered the source is allowed to stabilize and the output frequency is measured. The source is sequentially tested over a temperature range about a turning point of the crystal. In this way, the turning point on the FT response curve of the crystal can be located. Once located, the first memory is programmed with the value of the control signal appropriate to drive the substrate temperature to about the temperature of the turning point. At the same time the second memory is programmed with the appropriate frequency adjustment signal to tune the crystal oscillator to a desired customer frequency.

FIG. 3 shows a typical frequency-temperature (FT) response curve 80 of an AT-cut quartz crystal. The turning points 82 of the FT curve 80 are defined as a local maximum or minimum of the FT curve 80. Alternatively, the turning points 82 are defined as a point on the FT curve 80 where a slope is substantially zero. In a preferred embodiment, the turning point 82 is at a minimum on the FT response 80 of an AT-cut quartz crystal and somewhat above room temperature. The turning point is at a maximum on the FT response of an SC-cut quartz crystal (not shown) and somewhat above room temperature. Either cut can be used equally well. It should be recognized by those skilled in the art that many piezoelectric crystal and cuts having turning points at any temperature can be used equally well. Preferably, the substrate operating temperature is selected to be within about 0.5° C. of the actual crystal turning point.

Advantageously, the circuit complexity of the source is significantly reduced when the programmable IC is used. The IC controls both the substrate temperature setpoint and the crystal oscillator frequency in addition to providing external communication. The substrate temperature and oscillator frequency controls are achieved with analog signals produced by the IC. This has the advantages of lowering current drain over the use of separate discrete D/A converters, reducing parts count and reducing area. In one embodiment, the IC supplies a regulated voltage for the oscillator and the thermal element control and includes an output driver stage that provides either a sinewave or squarewave output signal from the frequency source. In a preferred embodiment, the driver stage of the IC includes a prescaler in a squarewave portion of the driver stage. The prescaler is programmed through the interface and the at least one non-volatile memory of the IC to provide a predetermined fixed integer division of the frequency of the oscillator.

The use of a programmable IC advantageously eliminates the use of separate fixed or variable components for adjusting the temperature chamber and the crystal oscillator. In addition, the IC allows external adjustment of the substrate temperature and crystal oscillator frequency before and after assembly of the frequency source or during later adjustment in the field. Also, the IC permits thermal and electrical adjustments without the need to mechanically or thermally disturb the internal circuitry of the frequency source which is sealed from the outside environment. These adjustments can be performed after the frequency source is sealed thereby compensating any effects that may cause the crystal FT response to shift during package sealing. Only one adjustment is needed to properly set the source, and this is best achieved after the source is sealed. The use of the IC to provide several different analog and digital functionalities reduces the number of components in the source, thereby lowering size and cost.

The use of the isothermal substrate advantageously eliminates the need for a separate oven chamber while also serving as a printed circuit board for all of the temperature critical components of the frequency source. This simplifies the source, reducing cost and size, while maintaining thermal stability.

FIG. 4 shows a method 100 for providing a temperature-controlled frequency source. A first step 102 of the method 100 includes providing a substantially isothermal substrate whereupon a crystal oscillator, a thermistor, a thermal element, a bridge circuit with first and second legs and a programmable IC with a memory are thermally and electrically coupled, and an encompassing package substantially sealing the source. A second step 104 provides for testing the source at different substrate temperatures so as to find a turning point on a crystal frequency-temperature response. A third step 106 includes programming the IC with a control signal value corresponding to the turning point. A fourth step 108 includes converting the control signal value to a control signal and applying the control signal to a second leg of the bridge circuit and a signal from the thermistor to the first leg of the bridge circuit such that a thermal feedback through the substrate maintains a substantially constant temperature at the crystal turning point resulting in a substantially stable output frequency from the frequency source. A fifth step 110 includes programming the IC with a frequency adjustment signal value corresponding to a desired output frequency. A sixth step 112 includes converting the frequency adjustment signal value to a frequency adjustment signal and applying the frequency adjustment signal to the oscillator such that the desired output frequency is obtained.

Experimental Data

The following experimental results serve to give an illustration of the practice of this invention, and are not intended in any way to limit the scope of this invention.

A frequency source was designed and built in accordance with the diagram in FIG. 4. The crystal used was an 8.192 MHz, third overtone, SC-cut quartz blank in an HC-37 package. The overall package dimensions of the frequency source were approximately 2.5 by 3.5 by 1.5 cm. The frequency adjustment capability was measured as a function of the varactor's effect on output frequency (pull sensitivity versus frequency adjustment signal voltage). The resultant varactor frequency pull sensitivity was about 700 parts per billion per volt (700 ppb/V). The substrate was made from 0.1 mm thick alumina.

Table 1 shows the results of testing the completed frequency source within a range of various ambient temperature environments. The output frequency was first measured at room temperature (about +25° C). This measurement was used as a reference baseline. Subsequent measurements were made at the indicated temperatures, and any frequency shifts from the reference baseline were determined. Afterwards, a last measurement was repeated at room temperature to establish the frequency hysteresis of the source. As can be seen, the use of a substantially isothermal substrate in place of a conventional oven chamber in an OCXO gave an unexpected and surprisingly stable output frequency. For the tested source, the frequency was stable to within less than 7 ppb, and frequency hysteresis was less than 1 ppb.

TABLE 1

| Frequency shift of source tested over temperature. | |
|---|---|
| Ambient temperature (°C.) | Frequency shift (ppb) |
| +25 | reference baseline |
| +70 | +2.99 |
| +50 | +1.96 |
| +10 | −1.73 |
| 0 | −2.50 |
| −15 | −4.27 |
| −30 | −6.20 |
| +25 | +0.76 |

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A temperature-controlled frequency source, comprising:

a substantially isothermal substrate;

an oscillator including a piezoelectric crystal having a frequency-temperature response curve, the crystal being thermally coupled to the substrate;

a thermal element being thermally coupled to the substrate, the thermal element for driving the substrate substantially to a turning point temperature of the frequency-temperature response curve of the crystal;

a bridge circuit having a first and second leg, the bridge circuit being electrically coupled to a bridge amplifier which provides a signal for driving the thermal element;

a temperature sensor being thermally coupled to the substrate and the crystal, the temperature sensor being electrically coupled in the first leg of the bridge circuit;

a programmable integrated circuit (IC) including at least one memory, the IC providing a control signal to the second leg of the bridge circuit such that a temperature of the substrate is controlled by the control signal, the IC also providing a frequency adjustment signal for controlling the oscillator; and a package encompassing the element, substrate, crystal oscillator, temperature sensor, bridge circuit and IC within a substantially sealed environment, the package includes a sealed electrical interface through which programming signals address the at least one memory of the IC.

2. The frequency source of claim 1, wherein the turning point is defined as at least one point on the frequency-temperature response curve of the crystal where a slope is zero.

3. The frequency source of claim 1, wherein the crystal is selected from one of the group of AT-cut quartz, SC-cut quartz, and IT-cut quartz resonators.

4. The frequency source of claim 2, wherein the substrate maintains the temperature of the crystal coupled thereto within about 0.5° C. of the turning point.

5. The frequency source of claim 1, wherein the IC supplies a regulated supply voltage for the bridge circuit such that a substantially uniform signal for driving the thermal element is provided.

6. The frequency source of claim 1, wherein the IC includes an output driver stage, a frequency of the oscillator being applied to the driver stage such that an output frequency of the source is selectable from a sinewave and a squarewave output.

7. The frequency source of claim 6, wherein the driver stage of the IC includes a prescaler, the prescaler being programmed through the at least one memory to provide a predetermined integer division of the frequency of the oscillator.

8. The frequency source of claim 1, wherein the thermal element is selected from at least one of the group consisting of a Peltier element, a resistive heating element and a current-pass transistor coupling waste heat to the substrate.

9. The frequency source of claim 1, wherein the substrate is selected from one of the group of alumina, aluminum nitride and beryllium oxide.

10. The frequency source of claim 1, wherein the IC includes first and second memories and first and second D/A converters, the first memory applies a first digital signal to the first converter such that the first converter provides an analog control signal to the second leg of the bridge circuit, the second memory applies a second digital signal to the second converter such that the second converter provides an analog frequency adjustment signal to the crystal oscillator.

11. The frequency source of claim 1, wherein the temperature sensor is selected from one of the group of a thermistor, a diode and a diode-connected transistor.

12. A temperature-controlled frequency source, comprising:

a substantially isothermal substrate;

an oscillator including a piezoelectric crystal having a frequency-temperature response curve, the crystal being thermally coupled to the substrate;

a thermal element including a resistive heating element and a current-pass transistor being thermally coupled to the substrate, the thermal element for driving the substrate substantially to a turning point temperature of the frequency-temperature response curve of the crystal defined by at least one point on the curve where a slope is zero;

a bridge circuit having a first and second leg, the bridge circuit being electrically coupled to a bridge amplifier which provides a signal for driving the thermal element;

a thermistor being thermally coupled to the substrate and the crystal, the thermistor being electrically coupled in the first leg of the bridge circuit;

a programmable integrated circuit (IC) including at least one memory and first and second D/A converters, the at least one memory applies a first digital signal to the first converter such that the first converter provides an analog control signal for controlling a temperature of the substrate to the second leg of the bridge circuit, the at least one memory applies a second digital signal to the second converter such that the second converter provides an analog frequency adjustment signal to the crystal oscillator; and a package encompassing the element, substrate, crystal oscillator, thermistor, bridge circuit and IC within a substantially sealed environment, the package includes a sealed electrical interface through which programming signals address the at least one memory of the IC.

13. The frequency source of claim 12, wherein the crystal is selected from one of the group of AT-cut quartz, SC-cut quartz, and IT-cut quartz resonators.

14. The frequency source of claim 12, wherein the thermal element maintains the temperature of the substrate and the crystal coupled thereto within about 0.5° C. of the turning point.

15. The frequency source of claim 12, wherein the IC supplies a regulated supply voltage for the bridge circuit such that a substantially uniform signal for driving the thermal element is provided.

16. The frequency source of claim 12, wherein the IC includes an output driver stage, a frequency of the oscillator being applied to the driver stage such that an output frequency of the source is selectable from a sinewave and a squarewave output.

17. The frequency source of claim 16, wherein the driver stage of the IC includes a prescaler, the prescaler being programmed through the at least one memory to provide a predetermined integer division of the frequency of the oscillator.

18. The frequency source of claim 12, wherein the substrate is selected from one of the group of alumina, aluminum nitride and beryllium oxide.

19. A method for a temperature-controlled frequency source, comprising the steps of:

providing a substantially isothermal substrate whereupon a crystal oscillator, a thermistor, a thermal element, a bridge circuit with first and second legs and a programmable IC with a memory are thermally and electrically coupled, and an encompassing package substantially sealing the source;

testing the source at different substrate temperatures so as to find a turning point on a crystal frequency-temperature response;

programming the IC with a control signal value corresponding to the turning point;

converting the control signal value to a control signal and applying the control signal to a second leg of the bridge circuit and a signal from the thermistor to the first leg of the bridge circuit such that a thermal feedback through the substrate maintains a substantially constant temperature at the crystal turning point resulting in a substantially stable output frequency from the frequency source;

programming the IC with a frequency adjustment signal value corresponding to a desired output frequency; and converting the frequency adjustment signal value to a frequency adjustment signal and applying the frequency adjustment signal to the oscillator such that the desired output frequency is obtained.

* * * * *